(12) United States Patent
Yang

(10) Patent No.: US 7,241,632 B2
(45) Date of Patent: Jul. 10, 2007

(54) MTJ READ HEAD WITH SIDEWALL SPACERS

(75) Inventor: Lin Yang, Milpitas, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 132 days.

(21) Appl. No.: 11/106,320

(22) Filed: Apr. 14, 2005

(65) Prior Publication Data

US 2006/0234445 A1 Oct. 19, 2006

(51) Int. Cl.
*H01L 21/00* (2006.01)

(52) U.S. Cl. ............... 438/3; 438/197; 438/381; 438/680; 438/692; 257/E21.17; 257/E21.221; 257/E21.304; 257/E21.293; 257/E21.006; 257/E21.646

(58) Field of Classification Search ........... 438/3, 438/257, 197, 381, 680, 692, 712, 733, 722, 438/723, 743, 744, 756, 757
See application file for complete search history.

(56) References Cited

U.S. PATENT DOCUMENTS

| | | | |
|---|---|---|---|
| 6,475,857 B1 | 11/2002 | Kim et al. ............... 438/240 |
| 6,555,858 B1 | 4/2003 | Jones et al. ............. 257/295 |
| 6,881,351 B2 * | 4/2005 | Grynkewich et al. ....... 216/22 |
| 6,911,156 B2 * | 6/2005 | Grynkewich et al. ....... 216/22 |
| 6,916,669 B2 * | 7/2005 | Jones et al. ............... 438/3 |
| 2004/0191928 A1 | 9/2004 | Shi ............................ 438/3 |
| 2004/0205958 A1 | 10/2004 | Grgnkewich et al. .... 29/603.14 |
| 2006/0183318 A1 * | 8/2006 | Liu et al. .................. 438/634 |

OTHER PUBLICATIONS

Co-pending U.S. Appl. No. 10/849,311, filed May 19, 2004, Hang et al., "MRAM Cell Structure and Method of Fabrication".

* cited by examiner

*Primary Examiner*—David Nhu
(74) *Attorney, Agent, or Firm*—Saile Ackerman LLC; Stephen B. Ackerman

(57) ABSTRACT

Following CMP, a magnetic tunnel junction stack may protrude through the oxide that surrounds it, making it susceptible to possible shorting to its sidewalls. The present invention overcomes this problem by depositing silicon nitride spacers on these sidewalls prior to oxide deposition and CMP. So, even though the stack may protrude through the top surface of the oxide after CMP, the spacers serve to prevent possible later shorting to the stack.

11 Claims, 5 Drawing Sheets

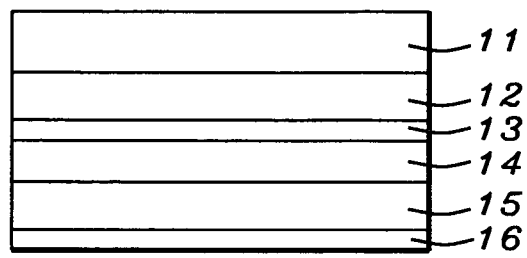
FIG. 1 – Prior Art
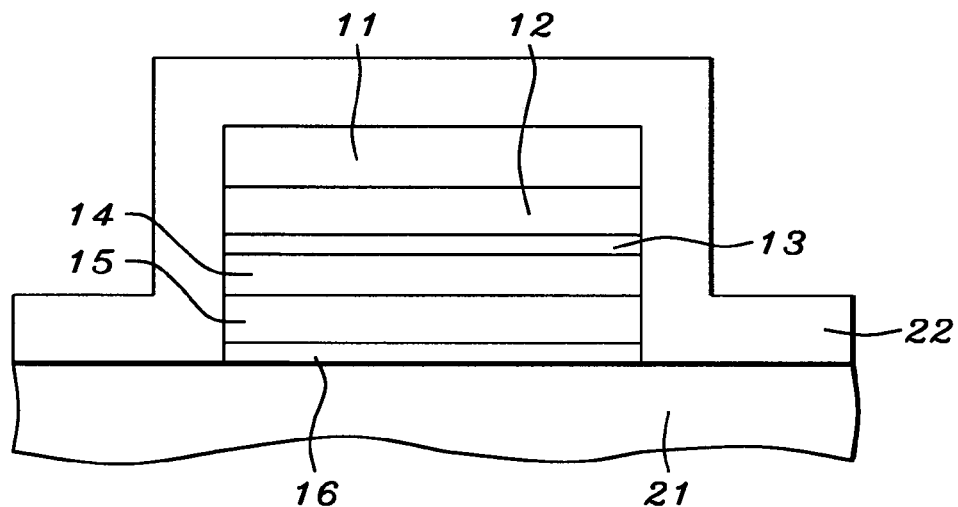
FIG. 2
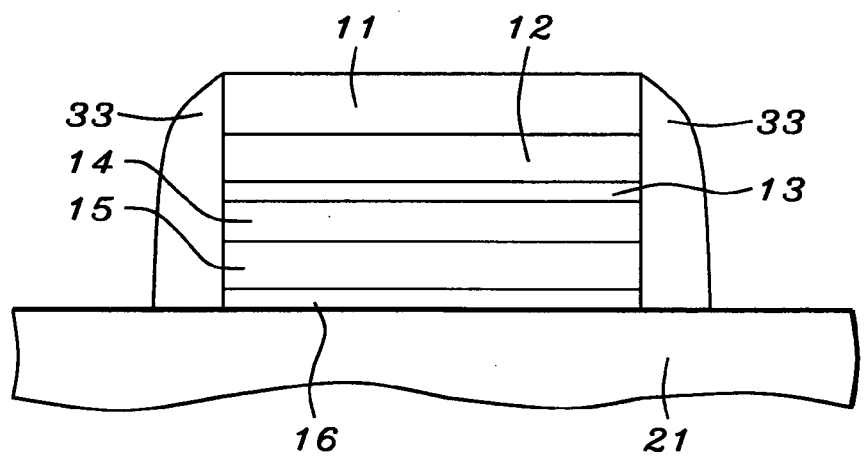
FIG. 3

MTJ READ HEAD WITH SIDEWALL SPACERS

FIELD OF THE INVENTION

The invention relates to the general field of magnetic disk storage with particular reference to reducing the occurrence of shorts in MTJs (magnetic tunnel junctions).

BACKGROUND OF THE INVENTION

MRAM (magnetic random access memory) architecture can be based on MTJs that sit at the intersection points of orthogonal wires running above and below them. A typical MTJ film stack is shown in FIG. 1. Seen at the top of the MTJ cell stack is cap layer 11, of (for example) tantalum. The reading of stored data can be accomplished by passing a low current through the MTJ. The orientation of its magnetic moment, parallel or antiparallel, determines in which of two possible resistance states tunnel barrier 13 happens to be, thereby defining a pair of binary memory states.

Also seen in FIG. 1 are seed layer 16, pinning layer 15, pinned layer (or layers if a trilayer synthetic antiferromagnetic is used) 14, dielectric tunneling layer 13, and free layer 12. The latter is itself often made up of two or more layers.

To write data, electric current needs to pass through the wires that are closest to the magnetic cells. The magnetic field induced by this current can alter the direction of the magnetic moment. These two sets of orthogonal wires are called word lines and bit lines. Currently, researchers worldwide are attempting to develop the processes needed for successful commercial production of MRAM.

CMP (chemical mechanical polishing) is one of the processes used in the manufacture MRAM devices. A dielectric layer is deposited on the patterned MTJ cells, and then CMP is employed to planarize the topography and remove excess dielectric material over the MTJ stacks thereby leaving the cells inlaid within the dielectric layer.

One of the major problems associated with CMP is the difference in polishing rate between the hard dielectric layer and the relatively soft MTJ cap material. Note that the use of words such as 'hard' and 'soft' may be somewhat confusing for understanding the protrusion of a soft MTJ from a hard dielectric after polishing. Although it is true that dielectrics are generally harder than metals in terms of their mechanical properties, CMP is a combined chemical and mechanical process that can polish 'hard' material faster than 'soft' material by selecting an appropriate chemistry, and vice versa.

Ideally, CMP should terminate right at the MTJ cap layer but, due to CMP non-uniformity and pattern dependence, the process requires over-polishing in order to ensure the complete exposure of the MTJ cap layer. If the cap layer removal rate is slower than the dielectric removal rate, MTJ caps will protrude through the dielectric layer at the conclusion of CMP. A protruded MTJ cap is vulnerable to the occurrence of electrical shorts.

Thus, controlling the variation of the cap layer CMP removal and MTJ cap protrusion presents one of the main challenges for MRAM manufacturing processes. However, if protrusion of the cap at the conclusion of CMP cannot be effectively prevented, an alternative way to prevent shorting to the protruding cap needs to be found. The present invention teaches several structures, and methods for their manufacture, that solve this problem.

A routine search of the prior art was performed with the following references of interest being found:

U.S. Pat. No. 6,555,858 (Jones et al) discloses magnetic cladding sidewall spacers.

U.S. Pat. No. 6,475,857 (Kim et al) describes dielectric sidewall spacers, but they are removed. U.S. Patent Application 2004/0205958 (Grynkewich et al) discloses sidewall spacers and a masking tab to reduce the likelihood of electrical shorting by preventing deposition of metallic particles during etching of the metal layers of the MTJ. The spacers also prevent shorting if a via overlying the MTJ stack is misaligned. U.S. Patent Application 2004/0191928 (Shi) shows sidewall spacers on an MTJ stack.

SUMMARY OF THE INVENTION

It has been an object of at least one embodiment of the present invention to provide a magnetic tunnel junction stack which, even though it protrudes above the surrounding oxide layer, is protected against possible shorting to its sidewalls.

Another object of at least one embodiment of the present invention has been to provide one or more processes for the manufacture of said stack.

These objects have been achieved by depositing silicon nitride spacers on the sidewalls of the magnetic tunnel junction stack before it is over-coated with oxide and then subjected to CMP. Even though the stack may protrude through the top surface of the oxide after CMP, the spacers serve to prevent any later shorting to the stack from misaligned wires. Two processes for manufacturing the stack are described. In the first process, tapered spacers are used while spacers of uniform thickness are created by the second process.

BRIEF DESCRIPTION OF THE DRAWINGS

FIG. 1 is a schematic cross-section of a typical MTJ stack.

FIG. 2 shows the starting point for both process embodiments.

FIG. 3 illustrates formation of tapered silicon nitride spacers.

DESCRIPTION OF THE PREFERRED EMBODIMENTS

We will describe below two process embodiments of the invention. In the course of these descriptions the structural outcomes of these processes will become apparent. Note that although the two dielectric materials used in our description of these two processes are silicon nitride and silicon oxide, the processes and associated structures are more general and would still be effective if other dielectric materials, such as alumina, or hybrid inorganic-organic materials are substituted. Similarly, the processes would still be effective for other cap materials besides tantalum, such as ruthenium.

1st EMBODIMENT

Referring now to FIG. 2, once the MTJ stack shown in FIG. 1 has been fabricated on substrate 21, silicon nitride layer 22 is deposited using a conformal deposition method such as low-pressure chemical vapor deposition (LPCVD) from, for example, a BTBAS (bis(tertiary-butylamino) silane) source. Typical deposition conditions are a BTBAS flow in the range of 40-100 sccm, ammonia: BTBAS ratios of 2:1 to 8:1, and a total pressure of 300-500 mT.

Then, as shown in FIG. 3, nitride layer 22 is anisotropically etched (using an etchant such as $Ar/CF_4/CHF_3/O_2$ at flow rates of 90/45/10/10 sccm respectively, at a power level of 400 W and a pressure of 50 mT. The anisotropic etching process etches much more rapidly in a vertical direction than in a lateral direction, i.e. the lateral etch ratio (horizontal etch rate/vertical etch rate) is close to zero. Etching is terminated when the surface of cap 11 has just been exposed, the result being the formation of spacers 33 on the MTJ's sidewalls, said spacers having the tapered shape seen in the figure.

Figure 4:
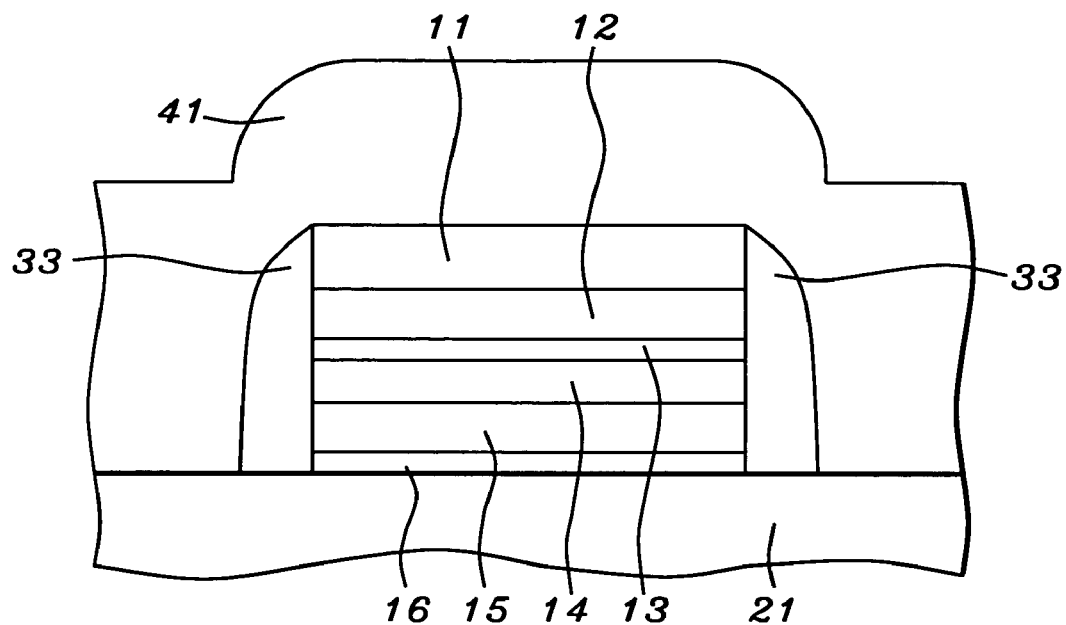
FIGS. 4-5 show that while the cap layer has protruded above the surrounding layer of silicon oxide, its sidewalls are protected by the spacers illustrated in FIG. 3.
Figure 5:
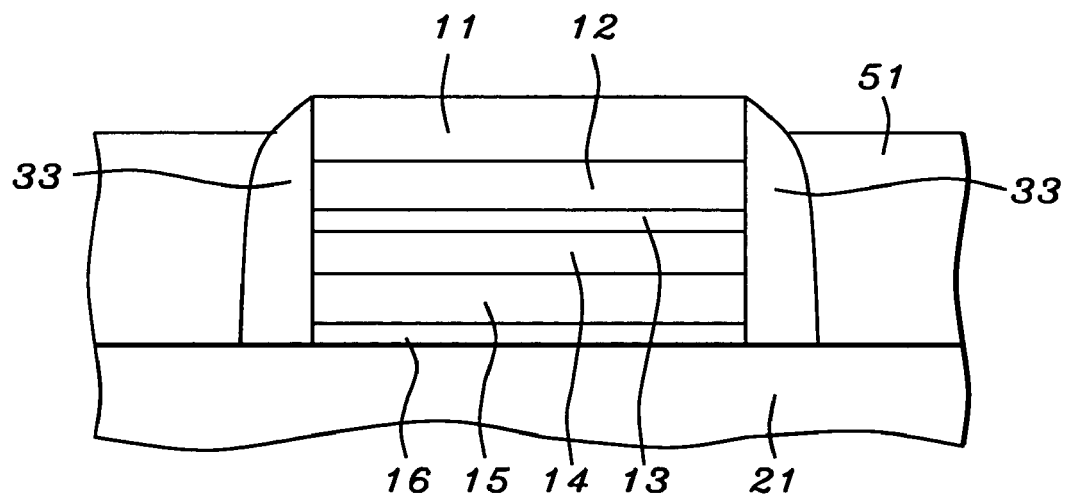

Next, following nitride spacer formation, layer of silicon oxide 41 is conformally deposited over all exposed surfaces. Our preferred process for said conformal deposition has been to use plasma-enhanced chemical vapor deposition (PECVD) from, for example, a TEOS (tetraethylorthosilicate) source, at a temperature between about 200° C. and 500° C. Oxide layer 41 is typically between about 1,000 and 3,000 Angstroms thick. The structure now has the appearance shown in FIG. 4, Referring next to FIG. 5, CMP is then used to planarize the topography. Polishing of the oxide continues until the top surface of cap 11 is fully exposed. As discussed earlier, the slower polishing rate of CMP over the soft cap surface relative to the polishing rate over the hard oxide surface, results in significant protrusion of the cap layer above the surface of polished oxide layer 51 before the cap's surface gets to be fully exposed. The amount of this protrusion is typically for the cap surface to end up about 200 to 400 Angstroms above the silicon oxide surface.

Note that, in order to avoid removal of the sidewall spacers and MTJ cap during CMP, it is essential to use a CMP process that is highly selective of oxide over nitride and tantalum. If a CMP process is used that is non-selective between oxide, nitride, and tantalum, the MTJ cap surface should end up at the same level as the surrounding oxide surface. However, for a typical cap layer only 300-400 Å thick, the process is practically uncontrollable with respect to post-CMP residual cap thickness. This is due to the lack of precise end-point detection capability, CMP nonuniformity across the wafer, and fluctuation of slurry selectivity. A non-selective process, therefore, usually ends up with a high variation of the MTJ cap thickness. This can degrade the MTJ device performance because the switching magnetic field at the free layer(s) is strongly dependent upon the distance between the bit line and the free layer(s). So large variations in MTJ tip thickness can cause degradation of the control of switching magnetic field and MTJ device performance.

A selective process essentially stops at the surface of the MTJ cap and sidewall spacers, and thus results in uniform cap thickness and intact sidewall spacers across the wafer. The drawback of the selective process is that the undesired protrusions that are formed after CMP can cause MTJ shorts later on. On the other hand, in order to prevent shorting, some MTJ designs have proposed using a very thick cap layer that can tolerate the MTJ protrusion problem. However, the disadvantage of a thick cap layer design is that it increases the distance between bit line and free layer and so reduces bit line writing efficiency.

CMP of the MTJ is preferably performed using a high selectivity slurry containing, for example, ceria or silica as the abrasive. The preferred pH of the slurry is between about 9 and 11. The preferred polishing pad is a polyurethane type pad such as IC1000 or IC1010 pad. Typical polishing conditions were a slurry flow rate in the range of 150-250 ml/min, polishing pressure of 2-4 psi, a pad conditioning force of 6-8 pounds and a platen speed of 30-50 rpm.

2nd EMBODIMENT

Figure 6:
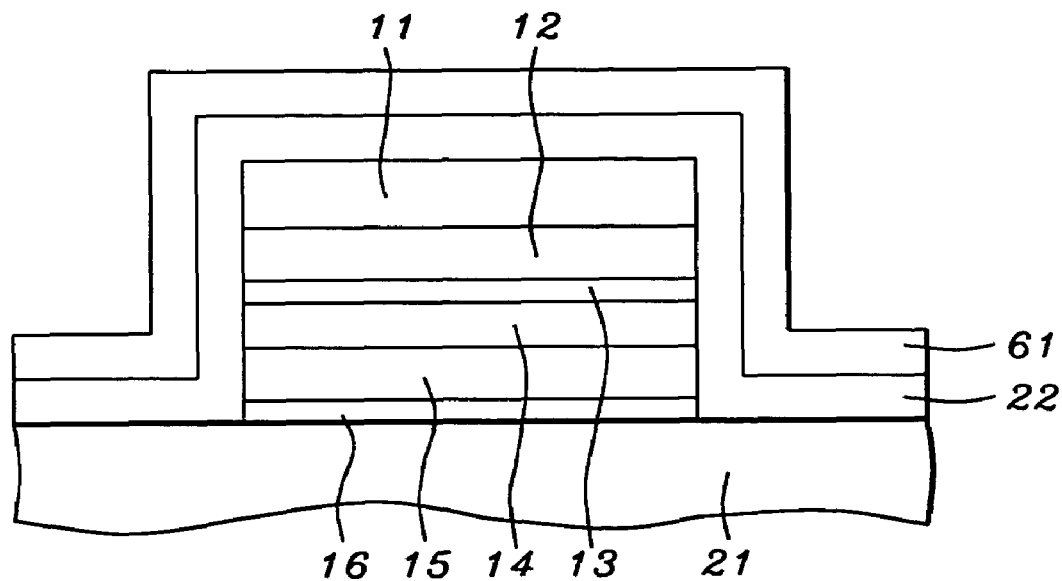
FIGS. 6-8 (second embodiment) illustrate the formation of silicon nitride spacers of uniform thickness.

This embodiment begins in the same manner as the first embodiment as illustrated in FIG. 2; once the MTJ stack seen in FIG. 1 has been fabricated on substrate 21, silicon nitride layer 22 is deposited using a conformal deposition method such as the one described in the first embodiment. This is followed by the deposition of a silicon oxide layer 61, as shown in FIG. 6, using a second conformal deposition method such as PECVD from, for example, a TEOS source, at a temperature between about 200° C. and 500° C. The oxide layer is typically between about 500 and 1,000 Angstroms thick.

Figure 7:
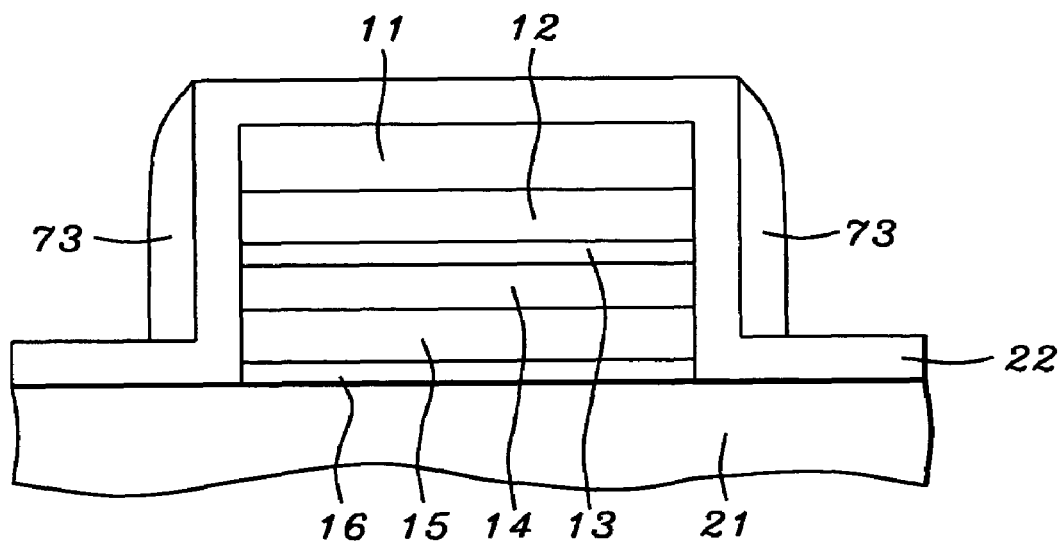

Oxide layer 61 is then anisotropically etched to form oxide spacers 73, that cover the MTJ sidewalls, in the same way that the silicon nitride spacers of the first embodiment were formed. This is illustrated in FIG. 7.

Figure 8:
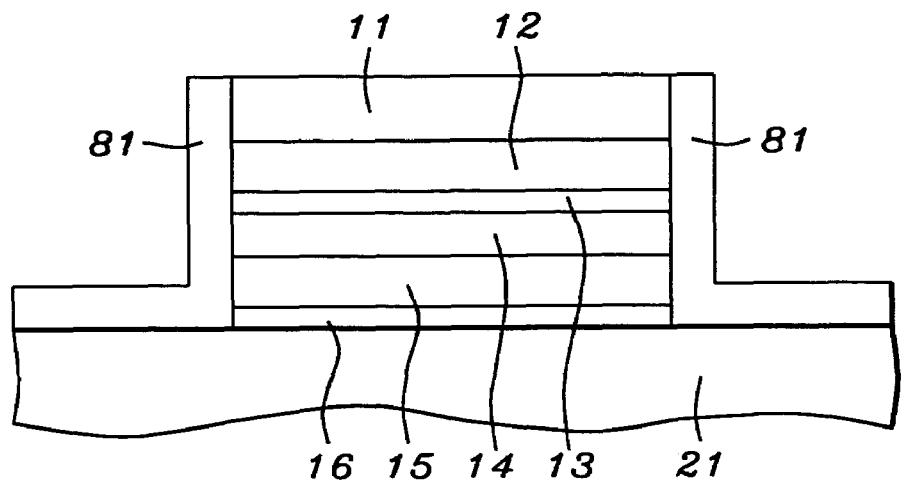

Referring next to FIG. 8, oxide spacers 73 are then used as a hard mask to allow removal of all exposed silicon nitride i.e. the silicon nitride not covered by spacers 73.

The effect on silicon nitride spacers 22 is to change them into L-shaped spacers 81 as seen in FIG. 8. Our preferred method for selectively removing silicon nitride in the presence of the silicon oxide has been a reactive ion etching (RIE) process such as using etchant $Ar/CF_4/CHF_3$, under the following conditions: 375 W power, 50 mT pressure, and flow rates of 65/10/35 sccm respectively.

Figure 9:
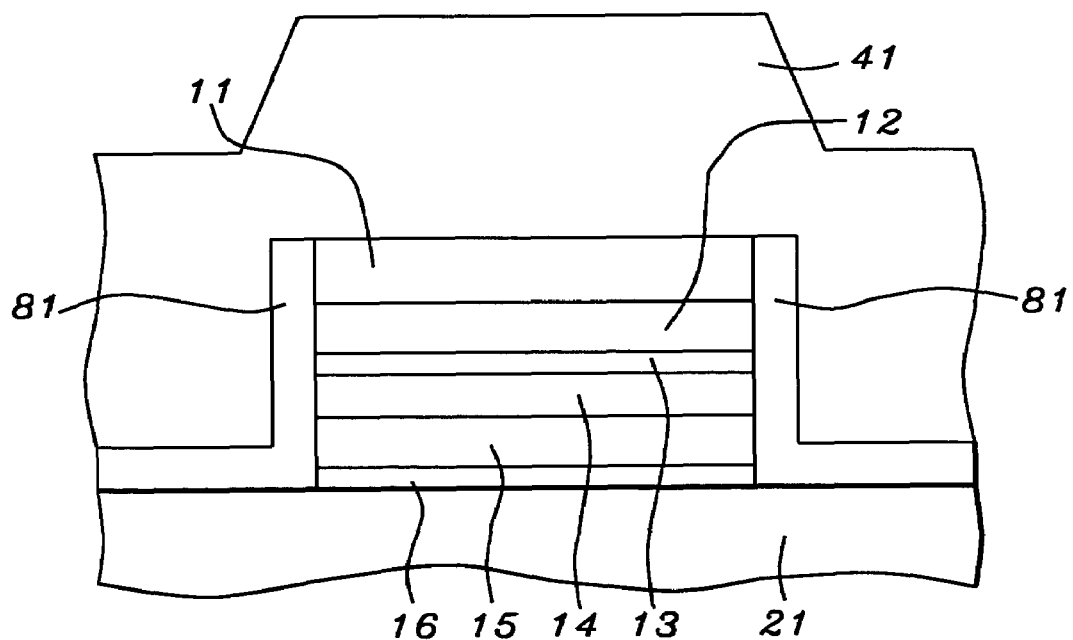
FIGS. 9-10 (second embodiment) show that while the cap layer has protruded above the surrounding layer of silicon oxide, its sidewalls are protected by spacers of uniform thickness.
Figure 10:
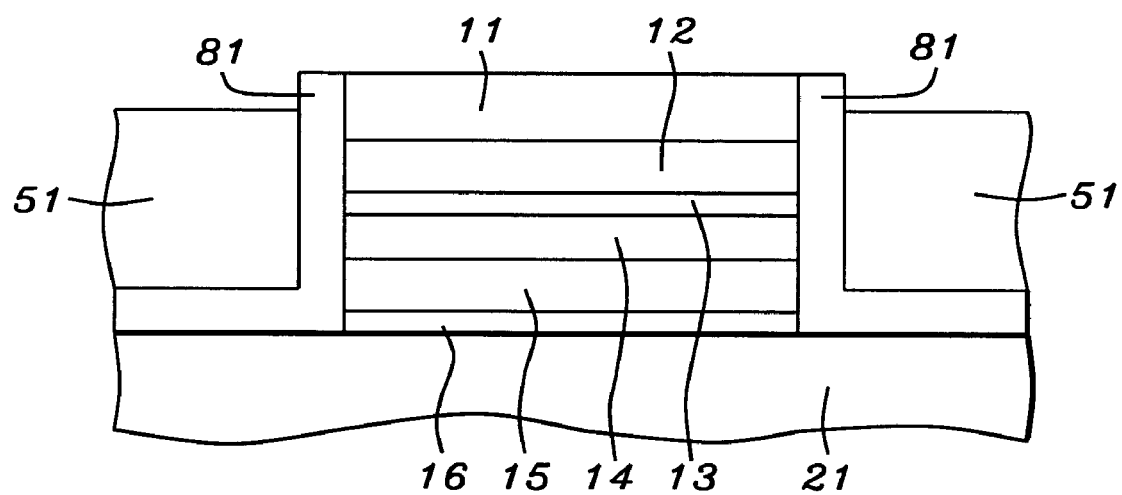

Once L-shaped spacers 81 have been formed, the process continues in the same manner as the first embodiment. Silicon oxide layer 41 is conformally deposited, as shown in FIG. 9, following which CMP is used to planarize the topography by polishing until the surface of cap layer 11 is fully exposed, as shown in FIG. 10.

What is claimed is:

1. A process to manufacture a MTJ stack that is free of shorting problems that arise from MTJ cap protrusion after CMP, comprising:

forming a MTJ stack, having sidewalls and a cap layer, on a substrate;

using a first conformal deposition method, depositing a layer of silicon nitride on said MTJ stack and on said substrate;

anisotropically etching said layer of silicon nitride until said cap layer is fully exposed, thereby forming spacers on said MTJ sidewalls;

using a second conformal deposition method, depositing a layer of silicon oxide, having a surface, on all exposed surfaces to form a structure; and applying a CMP process that further comprises:

using a high selectivity slurry containing an abrasive selected from the group consisting of ceria and silica at a pH between about 9 and 11, a polyurethane type pad, a slurry flow rate in the range of 150 to 250 ml/mm, a polishing pressure of 2 to 4 psi, a pad conditioning force of 6 to 8 pounds, and a platen speed of 30 to 50 rpm, selectively removing silicon oxide at a faster rate than silicon nitride and tantalum, thereby planarizing said structure until said cap layer and spacers protrude above said silicon oxide surface.

2. The process described in claim 1 wherein said first conformal deposition method further comprises using LPCVD from a BTBAS source with a BTBAS flow rate in the range of 40 to 100 sccm, an ammonia to BTBAS ratio between 2:1 to 8:1, and a total pressure of between 300 and 500 mT.

3. The process described in claim 1 wherein said second conformal deposition method further comprises using PECVD from a TEOS source, at a temperature between about 200° C. and 500° C.

4. The process described in claim 1 wherein said anisotropic etching method for silicon nitride further comprises using $Ar/CF_4/CHF_3/O_2$ at a flow of 90/45/10/10 sccm respectively at 400 W of power and a pressure of 50 mT.

5. The process described in claim 1 wherein, after CMP, said cap protrudes between about 200 and 400 Angstroms above the silicon surface.

6. A process to manufacture a MTJ stack that is free of shorting problems that arise from MTJ cap protrusion after CMP, comprising:

forming a MTJ stack, having sidewalls and a cap layer, on a substrate;

using a first conformal deposition method, depositing a layer of silicon nitride on said MTJ stack and on said substrate;

using a second conformal deposition method, depositing a first layer of silicon oxide on said layer of silicon nitride;

anisotropically etching said first layer of silicon oxide until said layer of silicon nitride is reached, thereby forming spacers on vertical portions of said layer of silicon nitride;

then, using said silicon oxide spacers as a hard mask, selectively removing all exposed silicon nitride thereby forming said silicon nitride layer into opposing L-shaped spacers on said MTJ sidewalls;

using said second conformal deposition method, depositing a second layer of silicon oxide, having a surface, on all exposed surfaces to form a structure; and using a CMP process that selectively removes silicon oxide at a faster rate than silicon nitride and tantalum, planarizing said structure until said cap layer and L-shaped spacers protrude above said silicon oxide surface.

7. The process described in claim 6 wherein said first conformal deposition method further comprises using LPCVD from a BTBAS source with a BTBAS flow rate in the range of 40 to 100 sccm, an ammonia to BTBAS ratio between 2:1 to 8:1, and a total pressure of between 300 and 500 mT.

8. The process described in claim 6 wherein said second conformal deposition method further comprises using PECVD from a TEOS source, at a temperature between about 200° C. and 500° C.

9. The process described in claim 6 wherein said anisotropic etching method for silicon oxide further comprises using $Ar/CF_4/CHF_3$ at flow rates of 65/10/35 sccm respectively at a 375 W power level and a pressure of 200 mT.

10. The process described in claim 6 wherein said CMP process further comprises:

using a high selectivity slurry containing an abrasive selected from the group consisting of ceria and silica at a pH between about 9 and 11;

using a polyurethane type pad;

using a slurry flow rate in the range of 150 to 250 ml/mm; and using a polishing pressure of 2 to 4 psi, a pad conditioning force of 6 to 8 pounds, and a platen speed of 30 to 50 rpm.

11. The process described in claim 6 wherein, after CMP, said cap protrudes between about 200 and 400 Angstroms above the silicon oxide surface.

* * * * *